US012787724B2

(12) United States Patent
Wang et al.

(10) Patent No.: US 12,787,724 B2
(45) Date of Patent: Nov. 3, 2026

(54) NEUTRAL STRESS DIAMOND-LIKE CARBON

(71) Applicant: Applied Materials, Inc., Santa Clara, CA (US)

(72) Inventors: Jialiang Wang, Santa Clara, CA (US); Soonil Lee, Santa Clara, CA (US); Eswaranand Venkatasubramanian, Santa Clara, CA (US); Abhijit B. Mallick, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 490 days.

(21) Appl. No.: 18/364,507

(22) Filed: Aug. 3, 2023

(65) Prior Publication Data

US 2025/0046611 A1 Feb. 6, 2025

(51) Int. Cl.

| | |
|---|---|
| ***H10P 76/40*** | (2026.01) |
| ***C23C 16/26*** | (2006.01) |
| ***C23C 16/509*** | (2006.01) |
| ***H01J 37/32*** | (2006.01) |
| ***H10P 14/60*** | (2026.01) |
| ***H10P 32/20*** | (2026.01) |
| ***H10P 50/00*** | (2026.01) |
| ***H10P 50/28*** | (2026.01) |

(52) U.S. Cl.

CPC ............ *H10P 76/405* (2026.01); *C23C 16/26* (2013.01); *C23C 16/509* (2013.01); *H10P 14/6336* (2026.01); *H10P 32/20* (2026.01); *H10P 50/282* (2026.01); *H10P 50/73* (2026.01); *H01J 37/32715* (2013.01); *H01J 2237/2007* (2013.01); *H01J 2237/332* (2013.01)

(58) Field of Classification Search

None

See application file for complete search history.

(56) References Cited

U.S. PATENT DOCUMENTS 4,783,368 A 11/1988 Yamamoto et al.
5,352,493 A 10/1994 Dorfman et al.
(Continued)

FOREIGN PATENT DOCUMENTS

JP 2010024476 A 2/2010
KR 20110115291 A 10/2011
(Continued)

OTHER PUBLICATIONS

Ban et al. "Diamond-like carbon films deposited by electron beam excited plasma chemical vapor deposition," Diamond and Related Materials, vol. 11, No. 7, Jul. 2002, pp. 1353-1359, <https://doi.org/10.1016/S0925-9635(01)00743-9>.
(Continued)

*Primary Examiner* — Alexander G Ghyka
(74) *Attorney, Agent, or Firm* — Patterson + Sheridan, LLP

(57) ABSTRACT

The present disclosure provides method of processing a substrate. The method includes flowing a deposition gas comprising a hydrocarbon compound into a processing volume of a process chamber having a substrate positioned on an electrostatic chuck. A plasma is generated at the substrate by applying a first RF bias to the electrostatic chuck to deposit a diamond-like carbon film on the substrate. The diamond-like carbon film is doped film with a hydrogen dopant to form a doped diamond-like carbon film. The hydrogen dopant is thermally annealing to the doped diamond-like carbon film.

20 Claims, 5 Drawing Sheets

(56) References Cited

U.S. PATENT DOCUMENTS

| | | | |
|---|---|---|---|
| 5,378,316 | A | 1/1995 | Franke et al. |
| 5,688,382 | A | 11/1997 | Besen et al. |
| 5,942,854 | A | 8/1999 | Ryoji et al. |
| 6,013,980 | A | 1/2000 | Goel et al. |
| 6,320,295 | B1 | 11/2001 | McGill et al. |
| 6,592,771 | B1 | 7/2003 | Yamanaka et al. |
| 6,900,002 | B1 | 5/2005 | Plat et al. |
| 6,930,048 | B1 | 8/2005 | Li et al. |
| 7,166,336 | B1 | 1/2007 | Mori et al. |
| 7,268,846 | B2 | 9/2007 | Hwang et al. |
| 7,824,498 | B2 | 11/2010 | Parkhe et al. |
| 7,942,111 | B2 | 5/2011 | Burger et al. |
| 8,105,660 | B2 | 1/2012 | Tudhope et al. |
| 8,119,240 | B2 | 2/2012 | Cooper |
| 8,361,906 | B2 | 1/2013 | Lee et al. |
| 8,547,006 | B1 | 10/2013 | Ives et al. |
| 8,852,348 | B2 | 10/2014 | Parkhe et al. |
| 9,269,587 | B2 | 2/2016 | Shimizu et al. |
| 9,305,802 | B2 | 4/2016 | Kim et al. |
| 9,362,292 | B1 | 6/2016 | Liaw |
| 9,520,295 | B2 | 12/2016 | Shaikh et al. |
| 9,695,593 | B2 | 7/2017 | Vokey et al. |
| 10,249,495 | B2 | 4/2019 | Yang et al. |
| 10,544,505 | B2 | 1/2020 | Yang et al. |
| 10,745,282 | B2 | 8/2020 | Venkatasubramanian et al. |
| 10,954,129 | B2 | 3/2021 | Koshizawa et al. |
| 11,043,372 | B2 | 6/2021 | Venkatasubramanian et al. |
| 11,043,375 | B2 | 6/2021 | Yang et al. |
| 11,062,897 | B2 | 7/2021 | Yu et al. |
| 2003/0180459 | A1 | 9/2003 | Redeker et al. |
| 2004/0026235 | A1 | 2/2004 | Stowell |
| 2006/0093803 | A1 | 5/2006 | Hwang et al. |
| 2006/0246290 | A1 | 11/2006 | Oda et al. |
| 2006/0264063 | A1 | 11/2006 | Stern et al. |
| 2007/0104867 | A1 | 5/2007 | Haba |
| 2007/0275569 | A1 | 11/2007 | Moghadam et al. |
| 2008/0053819 | A1 | 3/2008 | Hong et al. |
| 2008/0085604 | A1 | 4/2008 | Hoshino et al. |
| 2008/0099326 | A1 | 5/2008 | Ye et al. |
| 2008/0194169 | A1 | 8/2008 | Sterling et al. |
| 2009/0029067 | A1 | 1/2009 | Sciamanna et al. |
| 2009/0047760 | A1 | 2/2009 | Yamazaki et al. |
| 2009/0186206 | A1 | 7/2009 | Ito et al. |
| 2009/0212010 | A1 | 8/2009 | Wang et al. |
| 2011/0005681 | A1 | 1/2011 | Savas et al. |
| 2011/0017424 | A1 | 1/2011 | Parkhe et al. |
| 2011/0244142 | A1 | 10/2011 | Cheng et al. |
| 2011/0274852 | A1 | 11/2011 | Ito et al. |
| 2012/0276743 | A1 | 11/2012 | Won et al. |
| 2013/0146443 | A1 | 6/2013 | Papa et al. |
| 2014/0054658 | A1 | 2/2014 | Ma et al. |
| 2014/0170853 | A1 | 6/2014 | Shamma et al. |
| 2014/0335700 | A1 | 11/2014 | Denifl et al. |
| 2014/0345802 | A1 | 11/2014 | Umehara et al. |
| 2014/0370711 | A1 | 12/2014 | Cheng et al. |
| 2015/0200094 | A1 | 7/2015 | Underwood et al. |
| 2015/0348824 | A1 | 12/2015 | Kuenle et al. |
| 2015/0371851 | A1 | 12/2015 | Lee et al. |
| 2016/0042961 | A1 | 2/2016 | Dorf et al. |
| 2016/0053366 | A1 | 2/2016 | Stowell et al. |
| 2016/0086794 | A9 | 3/2016 | Cheng et al. |
| 2016/0147141 | A1 | 5/2016 | Ono et al. |
| 2016/0149128 | A1 | 5/2016 | Bodke et al. |
| 2016/0179005 | A1 | 6/2016 | Shamma et al. |
| 2016/0225632 | A1 | 8/2016 | Shaikh et al. |
| 2016/0276134 | A1 | 9/2016 | Collins et al. |
| 2016/0372307 | A1 | 12/2016 | Yang et al. |
| 2017/0103893 | A1 | 4/2017 | Kulshreshtha et al. |
| 2017/0372899 | A1 | 12/2017 | Yang et al. |
| 2018/0274089 | A1 | 9/2018 | Yang et al. |
| 2018/0274100 | A1 | 9/2018 | Yang et al. |
| 2018/0277340 | A1 | 9/2018 | Yang et al. |
| 2018/0354804 | A1 | 12/2018 | Venkatasubramanian et al. |
| 2018/0358220 | A1 | 12/2018 | Yu et al. |
| 2018/0358222 | A1 | 12/2018 | Venkatasubramanian et al. |
| 2018/0358229 | A1 | 12/2018 | Koshizawa et al. |
| 2019/0057862 | A1 | 2/2019 | Yang et al. |
| 2019/0228970 | A1 | 7/2019 | Yang et al. |
| 2019/0385907 | A1 | 12/2019 | Gottheim et al. |
| 2020/0331762 | A1 | 10/2020 | Venkatasubramanian et al. |
| 2021/0327752 | A1 | 10/2021 | Gottheim et al. |

FOREIGN PATENT DOCUMENTS

| | | | |
|---|---|---|---|
| KR | 20120121340 | A | 11/2012 |
| TW | 468209 | B | 12/2001 |
| WO | 2020092039 | A1 | 5/2020 |

OTHER PUBLICATIONS

Ban et al. "Stress and structural properties of diamond-like carbon films deposited by electron beam excited plasma CVD," Diamond and Related Materials, vol. 12, No. 1, Jan. 2003, pp. 47-56, <https://doi.org/10.1016/S0925-9635(02)00265-0>.

Ferrari et al., "Stress reduction and bond stability during thermal annealing of tetrahedral amorphous carbon", J. Appl. Phys., vol. 85, No. 10, May 15, 1999; 7 pages.

Moushinho et al. "High density plasma chemical vapor deposition of diamond-like carbon films," Microelectronics Journal, vol. 34, Nos. 5-8, May-Aug. 2003, pp. 627-629, <https://doi.org/10.1016/S0026-2692(03)00065-X>.

Zhu et al., "Modulationg Band Gap of Boron Doping in Amorphous Carbon Nano-Film", Materials May 31, 2019; 12, 1780; 9 pages.

International Search Report and Written Opinion dated Nov. 12, 2024 for Application No. PCT/US2024/039246.

Zhen Li et al. The effects of Cr and B doping on the mechanical properties and tribological behavior of multi-layered hydrogenated diamond-like carbon films. Surface and Coatings Technology vol. 431, Feb. 15, 2022 <https://www.sciencedirect.com/science/article/pii/S0257897221011518>,<https://doi.org/10.1016/j.surfcoat.2021.127977>.

NEUTRAL STRESS DIAMOND-LIKE CARBON

BACKGROUND

Field

Embodiments of the present disclosure generally relate to the fabrication of integrated circuits. More particularly, the embodiments described herein provide techniques for deposition of high-density films for patterning applications.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it becomes necessary to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer step due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having high etch selectivity, high Young's Modulus, and high deposition rates are desirable. As critical dimensions (CD) decrease, many current hardmask materials lack the desired etch selectivity relative to underlying materials (e.g., oxides and nitrides), do not have a high modulus, and are often difficult to deposit. Current hardmask materials having high etch selectivity, high modulus, and high deposition rates often have high levels of stress, particularly compressive stress, which may yield line wiggling in the hardmask, causing abnormalities in the integrated circuit.

Therefore, there is a need in the art for improved hardmask layers and methods for depositing improved hardmask layers.

SUMMARY

In an aspect, the present disclosure provides method of processing a substrate. The method includes flowing a deposition gas comprising a hydrocarbon compound into a processing volume of a process chamber having a substrate positioned on an electrostatic chuck. A plasma is generated at the substrate by applying a first RF bias to the electrostatic chuck to deposit a diamond-like carbon film on the substrate. The diamond-like carbon film is doped film with a hydrogen dopant to form a doped diamond-like carbon film. The hydrogen dopant is thermally annealed to the doped diamond-like carbon film.

In another aspect, the present disclosure provides method of processing a substrate. The method includes flowing a deposition gas comprising a hydrocarbon compound and a hydrogen dopant into a processing volume of a process chamber having a substrate positioned on an electrostatic chuck. The processing volume is maintained at a pressure of about 0.5 m Torr to about 10 Torr. A plasma is generated at the substrate by applying a first RF bias to the electrostatic chuck to deposit a doped diamond-like carbon film on the substrate formed by the hydrocarbon compound and the hydrogen dopant. The hydrogen dopant is thermally annealed to the doped diamond-like carbon film.

In another aspect, the present disclosure provides method of processing a substrate. The method includes flowing a deposition gas comprising a hydrocarbon compound and a hydrogen dopant into a processing volume of a process chamber having a substrate positioned on an electrostatic chuck. The electrostatic chuck includes a chucking electrode and an RF electrode separate from the chucking electrode. The processing volume is maintained at a pressure of about 0.5 mTorr to about 10 Torr. A plasma is generated at the substrate by applying a first RF bias to the RF electrode to deposit a doped diamond-like carbon film on the substrate formed by the hydrocarbon compound and the hydrogen dopant. The doped diamond-like carbon film has a density of greater than 2.5 g/cc. The hydrogen dopant is thermally annealed to the doped diamond-like carbon film at a temperature of about 300 to about 500 degrees Celsius for a time of about 2 minutes to about 10 minutes, in which the doped diamond-like carbon film has a substantially neutral stress. A patterned photoresist layer is formed over the doped diamond-like carbon film. The doped diamond-like carbon film is etched in a pattern corresponding with the patterned photoresist layer. The pattern is etched into the substrate.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of scope, for the disclosure may admit to other equally effective implementations.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
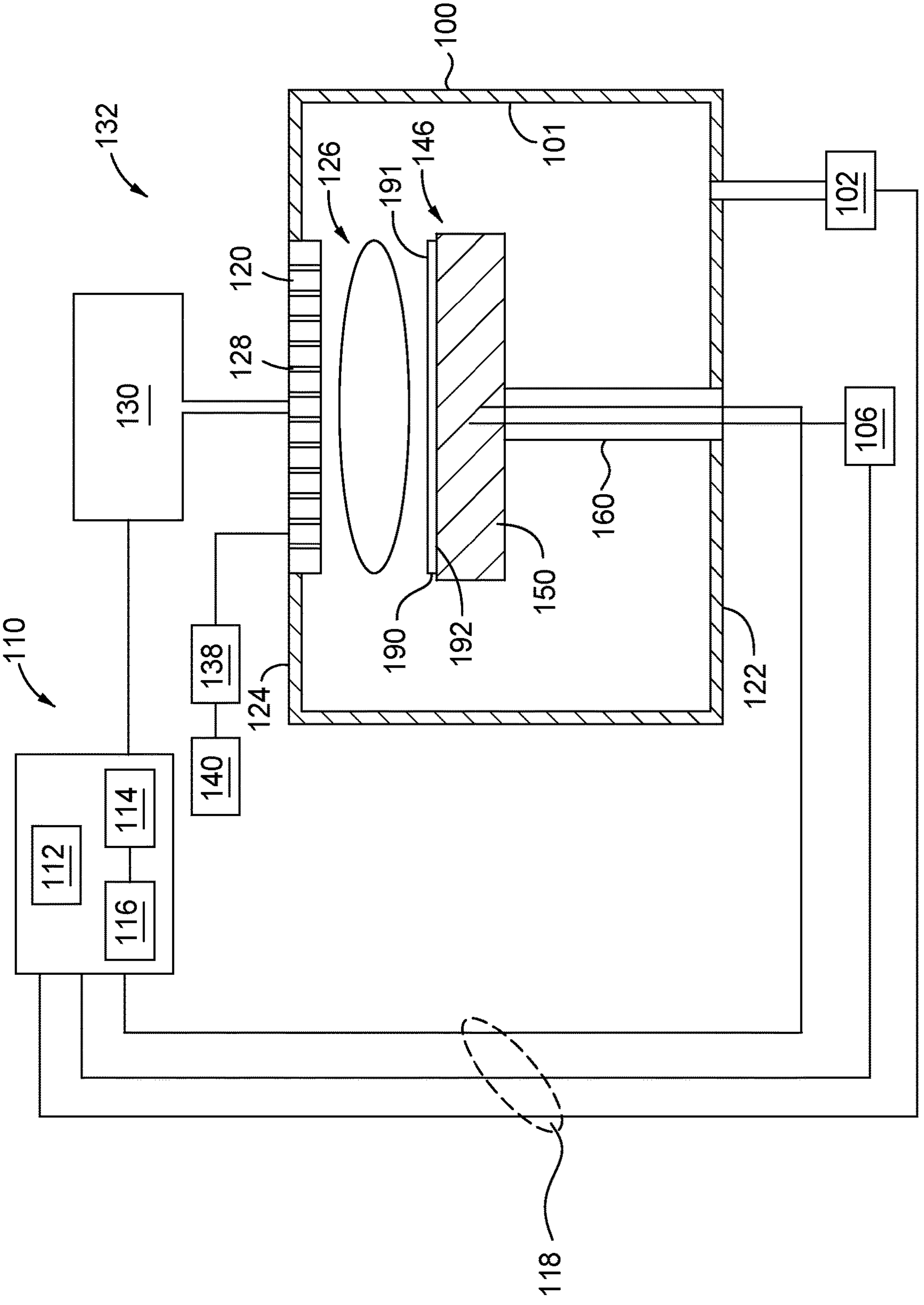
FIG. 1A depicts a schematic cross-sectional view of a deposition system that can be used for the practice of embodiments described herein.

Embodiments provided herein relate to doped diamond-like carbon films and methods for depositing or otherwise forming the doped diamond-like carbon films on a substrate. Certain details are set forth in the following description and in FIGS. 1A-4 to provide a thorough understanding of various embodiments of the disclosure. Other details describing well-known structures and systems often associated with plasma processing and doped diamond-like carbon film deposition are not set forth in the following disclosure to avoid unnecessarily obscuring the description of the various embodiments.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

Current hardmask applications for memory and other devices largely make use of thick carbon films (e.g., about 300 nm to about 1.5 microns) that are amorphous in nature. However, the etch selectivity of such films is no longer sufficient to meet the increasingly stringent requirements and the high-aspect ratio etch of the technology nodes. To achieve greater etch selectivity, the density and the Young's modulus of the film needs to be improved.

One of the main challenges in achieving greater etch selectivity and improved Young's modulus is the high compressive stress of such a film, making the film unsuitable for applications owing to the resultant high wafer/substrate bow and line wiggling issues. Hence there is a need for carbon (e.g., diamond-like) films having high-density and modulus (e.g., greater $sp^3$ content, more diamond-like) and having high etch selectivity along with reduced compressive stress.

Embodiments described herein, include improved methods of fabricating doped diamond-like carbon films with high-density (e.g., >2 g/cc), high modulus (e.g., >150 GPa), and low or neutral stress profile. The doped diamond-like carbon films fabricated according to various embodiments described herein are amorphous in nature and have a greater etch selectivity, greater modulus (e.g., >150 GPa), and lower stress (e.g., <200 MPa) than current patterning films. The doped diamond-like carbon films may have a high $sp^3$ carbon content. In general, the deposition processes described herein are also fully compatible with current integration schemes for hardmask applications.

In one or more embodiments, the doped diamond-like carbon films described herein may be formed by chemical vapor deposition (CVD, such as plasma enhanced CVD and/or thermal CVD processes, using a deposition gas containing one or more hydrocarbon compounds and one or more dopant compounds. Exemplary hydrocarbon compounds may include ethyne or acetylene ($C_2H_2$), propene ($C_3H_6$), methane ($CH_4$), butene ($C_4H_8$), 1,3-dimethyladamantane, bicyclo[2.2.1]hepta-2,5-diene (2,5-norbornadiene), adamantine ($C_{10}H_{16}$), norbornene ($C_7H_{10}$), derivatives thereof, isomers thereof, or any combination thereof.

The dopant compound may include one or more metal dopants, one or more non-metal dopants, or combinations thereof. The dopant compound can be one or more chemical precursors used in a vapor deposition process, such as CVD or ALD. The metal dopant may include one or more of tungsten, molybdenum, cobalt, nickel, vanadium, hafnium, zirconium, tantalum, or any combination thereof. As such, the metal dopant may include one or more of tungsten precursors, molybdenum precursors, cobalt precursors, nickel precursors, vanadium precursors, hafnium precursors, zirconium precursors, tantalum precursors, or any combination thereof. Exemplary metal dopants may include tungsten hexafluoride, tungsten hexacarbonyl, molybdenum pentachloride, cyclopentadienyl dicarbonyl cobalt, dicobalt hexacarbonyl butylacetylene (CCTBA), bis(cyclopentadienyl) cobalt, bis(methylcyclopentadienyl) nickel, vanadium pentachloride, hafnium tetrachloride, tetrakis(dimethylamino) hafnium, tetrakis(diethylamino) hafnium, zirconium tetrachloride, bis(cyclopentadienyl) zirconium dihydride, tetrakis(dimethylamino) zirconium, tetrakis(diethylamino) zirconium, tantalum pentachloride, tantalum pentafluoride, pentakis(dimethylamino) tantalum, pentakis(diethylamino) tantalum, pentakis(ethylmethylamino) tantalum, adducts thereof, derivatives thereof, or any combination thereof. The non-metal dopant may include one or more of boron, silicon, germanium, nitrogen, phosphorous, or any combination thereof. As such, the non-metal dopant may include one or more of boron precursors, silicon precursors, germanium precursors, nitrogen precursors, phosphorous precursors, or any combination thereof. Exemplary non-metal dopants may include disilane, diborane, triethylborane, silane, disilane, trisilane, germane, ammonia, hydrazine, phosphine, abducts thereof, or any combination thereof.

In various embodiments, the substrate and the processing volume may be heated and maintained at independent temperatures during the deposition process. The substrate and/or the processing volume can be heated to a temperature of about −50° C., about −25° C., about −10° C., about −5° C., about 0° C., about 5° C., or about 10° C. to about 15° C., about 20° C., about 23° C., about 30° C., about 50° C., about 100° C., about 150° C., about 200° C., about 300° C., about 400° C., about 500° C., or about 600° C. For example, the substrate and/or the processing volume can be heated to a temperature of about −50° C. to about 600° C., about −50° C. to about 450° C., about −50° C. to about 350° C., about −50° C. to about 200° C., about −50° C. to about 100° C., about −50° C. to about 50° C., about −50° C. to about 0° C., about 0° C. to about 600° C., about 0° C. to about 450° C., about 0° C. to about 350° C., about 0° C. to about 200° C., about 0° C. to about 120° C., about 0° C. to about 100° C., about 0° C. to about 80° C., about 0° C. to about 50° C., about 0° C. to about 25° C., about 10° C. to about 600° C., about 10° C. to about 450° C., about 10° C. to about 350°

C., about 10° C. to about 200° C., about 10° C. to about 100° C., or about 10° C. to about 50° C.

The processing volume of the processing chamber may be maintained at sub-atmospheric pressures during the deposition process. The processing volume of the processing chamber may be maintained at a pressure of about 0.1 mTorr, about 0.5 m Torr, about 1 m Torr, about 5 m Torr, about 10 mTorr, about 50 m Torr, or about 80 m Torr to about 100 m Torr, about 250 m Torr, about 500 mTorr, about 1 Torr, about 5 Torr, about 10 Torr, about 20 Torr, about 50 Torr, or about 100 Torr. For example, the processing volume of the processing chamber may be maintained at a pressure of about 0.1 mTorr to about 10 Torr, about 0.1 m Torr to about 5 Torr, about 0.1 m Torr to about 1 Torr, about 0.1 mTorr to about 500 m Torr, about 0.1 m Torr to about 100 mTorr, about 0.1 mTorr to about 10 mTorr, about 1 mTorr to about 10 Torr, about 1 m Torr to about 5 Torr, about 1 m Torr to about 1 Torr, about 1 mTorr to about 500 mTorr, about 1 mTorr to about 100 m Torr, about 1 m Torr to about 10 mTorr, about 5 mTorr to about 10 Torr, about 5 mTorr to about 5 Torr, about 5 mTorr to about 1 Torr, about 5 mTorr to about 500 mTorr, about 5 mTorr to about 100 mTorr, or about 5 m Torr to about 10 m Torr.

The deposition gas may further include one or more dilution gases, carrier gases, and/or purge gases, such as, for example, helium, argon, xenon, neon, nitrogen ($N_2$), hydrogen ($H_2$), or any combination thereof. The deposition gas may further include etchant gases such as chlorine ($Cl_2$), carbon tetrafluoride ($CF_4$), and/or nitrogen trifluoride ($NF_3$) to improve film quality. The plasma (e.g., capacitively-coupled plasma) may be formed from either top and bottom electrodes or side electrodes. The electrodes may be formed from a single powered electrode, dual powered electrodes, or more electrodes with multiple frequencies such as, but not limited to, about 350 KHz, about 2 MHz, about 13.56 MHz, about 27 MHz, about 40 MHz, about 60 MHz, and about 100 MHz, being used alternatively or simultaneously in a CVD system with any or all of the reactant gases listed herein to deposit a thin film of diamond-like carbon for use as a hardmask and/or etch stop or any other application requiring smooth carbon films. The high etch selectivity of the doped diamond-like carbon film is achieved by having greater density and modulus than current generation films. Without being bound by theory, it is believed that the greater density and modulus may be a result of the high content of $sp^3$ hybridized carbon atoms in the doped diamond-like carbon film, which in turn may be achieved by a combination of low pressure and low plasma power.

In one or more embodiments, the doped diamond-like carbon film may be deposited in a chamber with substrate pedestal maintained at about 10° C. and the pressure maintained at about 2 mTorr, with plasma generated at the substrate level by applying a bias of about 2,500 watts (about 13.56 MHz) to the electrostatic chuck. In other embodiments, additional RF of about 1,000 watts at about 2 MHz may also be delivered to the electrostatic chuck thus generating a dual-bias plasma at the substrate level.

In one or more embodiments, hydrogen dopants having one or more hydrogen radicals are fed through an RPS, which leads to selective etching of $sp^2$ hybridized carbon atoms thus increasing the $sp^3$ hybridized carbon atom fraction of the film further, thus further increasing the etch selectivity. The doped diamond-like carbon film can have a concentration or percentage of $sp^3$ hybridized carbon atoms (e.g., a $sp^3$ hybridized carbon atom content) that is at least 40 atomic percent (at %), about 45 at %, about 50 at %, about 55 at %, or about 58 at % to about 60 at %, about 65 at %, about 70 at %, about 75 at %, about 80 at %, about 85 at %, about 88 at %, about 90 at %, about 92 at %, or about 95 at %, based on the total amount of carbon atoms in the doped diamond-like carbon film. For example, the doped diamond-like carbon film can have a concentration or percentage of $sp^3$ hybridized carbon atoms that is at least 40 at % to about 95 at %, about 45 at % to about 95 at %, about 50 at % to about 95 at %, about 50 at % to about 90 at %, about 50 at % to about 85 at %, about 50 at % to about 80 at %, about 50 at % to about 75 at %, about 50 at % to about 70 at %, about 50 at % to about 65 at %, about 65 at % to about 95 at %, about 65 at % to about 90 at %, about 65 at % to about 85 at %, about 65 at % to about 80 at %, about 65 at % to about 75 at %, about 65 at % to about 70 at %, about 65 at % to about 68 at %, about 75 at % to about 95 at %, about 75 at % to about 90 at %, about 75 at % to about 85 at %, about 75 at % to about 80 at %, or about 75 at % to about 78 at %, based on the total amount of carbon atoms in the doped diamond-like carbon film.

The doped diamond-like carbon film can have a concentration or percentage of the hydrogen dopant of about 0.01 at %, about 0.05 at %, about 0.1 at %, about 0.3 at %, about 0.5 at %, about 0.8 at %, about 1 at %, about 1.2 at %, about 1.5 at %, about 1.8 at %, about 2 at %, about 2.5 at %, or about 2.8 at % to about 3 at %, about 3.5 at %, about 4 at %, about 5 at %, about 6 at %, about 7 at %, about 8 at %, about 9 at %, about 10 at %, about 12 at %, about 15 at %, about 18 at %, about 20 at %, about 25 at %, about 30 at %, or greater, based on the total amount of hydrogen atoms in the doped diamond-like carbon film. For example, the doped diamond-like carbon film can have a concentration or percentage of the hydrogen dopant of about 0.01 at % to about 25 at %, about 0.1 at % to about 25 at %, about 0.5 at % to about 25 at %, about 1 at % to about 25 at %, about 2 at % to about 25 at %, about 3 at % to about 25 at %, about 5 at % to about 25 at %, about 7 at % to about 25 at %, about 10 at % to about 25 at %, about 12 at % to about 25 at %, about 15 at % to about 25 at %, about 18 at % to about 25 at %, about 20 at % to about 25 at %, about 0.1 at % to about 20 at %, about 0.5 at % to about 20 at %, about 1 at % to about 20 at %, about 2 at % to about 20 at %, about 3 at % to about 20 at %, about 5 at % to about 20 at %, about 7 at % to about 20 at %, about 10 at % to about 20 at %, about 12 at % to about 20 at %, about 15 at % to about 20 at %, about 18 at % to about 20 at %, about 0.1 at % to about 18 at %, about 0.5 at % to about 18 at %, about 1 at % to about 18 at %, about 2 at % to about 18 at %, about 3 at % to about 18 at %, about 5 at % to about 18 at %, about 7 at % to about 18 at %, about 10 at % to about 18 at %, about 12 at % to about 18 at %, about 15 at % to about 18 at %, about 0.1 at % to about 15 at %, about 0.5 at % to about 15 at %, about 1 at % to about 15 at %, about 2 at % to about 15 at %, about 3 at % to about 15 at %, about 5 at % to about 15 at %, about 7 at % to about 15 at %, about 10 at % to about 15 at %, about 12 at % to about 15 at %, about 0.01 at % to about 10 at %, about 0.1 at % to about 10 at %, about 0.5 at % to about 10 at %, about 1 at % to about 10 at %, about 2 at % to about 10 at %, about 3 at % to about 10 at %, about 4 at % to about 10 at %, about 5 at % to about 10 at %, about 7 at % to about 10 at %, about 0.01 at % to about 5 at %, about 0.1 at % to about 5 at %, about 0.5 at % to about 5 at %, about 1 at % to about 5 at %, about 2 at % to about 5 at %, or about 3 at % to about 5 at %, based on the total amount of hydrogen atoms in the doped diamond-like carbon film.

The doped diamond-like carbon film has a density of greater than 2 g/cc, such as about 2.1 g/cc, about 2.2 g/cc, about 2.3 g/cc, about 2.4 g/cc, about 2.5 g/cc, about 2.6 g/cc, about 2.7 g/cc, about 2.8 g/cc, about 2.9 g/cc, or about 3 g/cc to about 3.1 g/cc, about 3.2 g/cc, about 3.4 g/cc, about 3.5 g/cc, about 3.6 g/cc, about 3.8 g/cc, about 4 g/cc, about 4.5 g/cc, about 5 g/cc, about 5.5 g/cc, about 6 g/cc, about 6.5 g/cc, about 7 g/cc, about 8 g/cc, about 9 g/cc, about 10 g/cc, about 11 g/cc, about 12 g/cc, or greater. For example, the doped diamond-like carbon film has a density of greater than 2 g/cc to about 12 g/cc, greater than 2 g/cc to about 10 g/cc, greater than 2 g/cc to about 8 g/cc, greater than 2 g/cc to about 7 g/cc, greater than 2 g/cc to about 5 g/cc, greater than 2 g/cc to about 4 g/cc, greater than 2 g/cc to about 3 g/cc, greater than or about 2.5 g/cc to about 12 g/cc, greater than or about 2.5 g/cc to about 10 g/cc, greater than or about 2.5 g/cc to about 8 g/cc, greater than or about 2.5 g/cc to about 7 g/cc, greater than or about 2.5 g/cc to about 5 g/cc, greater than or about 2.5 g/cc to about 4 g/cc, greater than or about 2.5 g/cc to about 3 g/cc, greater than or about 3 g/cc to about 12 g/cc, greater than or about 3 g/cc to about 10 g/cc, greater than or about 3 g/cc to about 8 g/cc, greater than or about 3 g/cc to about 7 g/cc, greater than or about 3 g/cc to about 5 g/cc, greater than or about 3 g/cc to about 4 g/cc, or greater than or about 3 g/cc to about 3.5 g/cc.

The doped diamond-like carbon film can have a thickness of about 5 Å, about 10 Å, about 50 Å, about 100 Å, about 150 Å, about 200 Å, or about 300 Å to about 400 Å, about 500 Å, about 800 Å, about 1,000 Å, about 2,000 Å, about 3,000 Å, about 5,000 Å, about 8,000 Å, about 10,000 Å, about 15,000 Å, about 20,000 Å, or thicker. For example, the doped diamond-like carbon film can have a thickness of about 5 Å to about 20,000 Å, about 5 Å to about 10,000 Å, about 5 Å to about 5,000 Å, about 5 Å to about 3,000 Å, about 5 Å to about 2,000 Å, about 5 Å to about 1,000 Å, about 5 Å to about 500 Å, about 5 Å to about 200 Å, about 5 Å to about 100 Å, about 5 Å to about 50 Å, about 300 Å to about 20,000 Å, about 300 Å to about 10,000 Å, about 00 Å to about 5,000 Å, about 300 Å to about 3,000 Å, about 300 Å to about 2,000 Å, about 300 Å to about 1,000 Å, about 300 Å to about 500 Å, about 300 Å to about 200 Å, about 300 Å to about 100 Å, about 300 Å to about 50 Å, about 1,000 Å to about 20,000 Å, about 1,000 Å to about 10,000 Å, about 1,000 Å to about 5,000 Å, about 1,000 Å to about 3,000 Å, about 1,000 Å to about 2,000 Å, about 2,000 Å to about 20,000 Å, or about 2,000 Å to about 3,000 Å.

The doped diamond-like carbon film can have a refractive index or n-value (n (at 633 nm)) of greater than 2, such as about 2.1, about 2.2, about 2.3, about 2.4 or about 2.5 to about 2.6, about 2.7, about 2.8, about 2.9, or about 3. For example, the doped diamond-like carbon film can have a refractive index or n-value (n (at 633 nm)) of greater than 2 to about 3, greater than 2 to about 2.8, greater than 2 to about 2.5, greater than 2 to about 2.3, about 2.1 to about 3, about 2.1 to about 2.8, about 2.1 to about 2.5, about 2.1 to about 2.3, about 2.3 to about 3, about 2.3 to about 2.8, or about 2.3 to about 2.5.

The doped diamond-like carbon film can have an extinction coefficient or k-value (K (at 633 nm)) of greater than 0.1, such as about 0.15, about 0.2, about 0.25, or about 0.3. For example, the doped diamond-like carbon film can have an extinction coefficient or k-value (K (at 633 nm)) of greater than 0.1 to about 0.3, greater than 0.1 to about 0.25, greater than 0.1 to about 0.2, greater than 0.1 to about 0.15, about 0.2 to about 0.3, or about 0.2 to about 0.25.

The doped diamond-like carbon film can have a compressive stress of less than or equal to 200 MPa, about 150 MPa or less, about 100 MPa or less, about 50 MPa or less, about 0 MPa or less, about −50 MPa or less, about −100 MPa or less, about −150 MPa or less, about −200 MPa or less, about −250 MPa or less, about −275 MPa or less, about −300 MPa or less, about −350 MPa or less, about −400 MPa or less, about −450 MPa or less, about −500 MPa or less, about −550 MPa or less, about −600 MPa, or less. For example, the doped diamond-like carbon film can have a compressive stress of about −600 MPa to about −300 MPa, about −600 MPa to about −350 MPa, about −600 MPa to about −400 MPa, about −600 MPa to about −450 MPa, about 600 MPa to about −500 MPa, about −600 MPa to about −550 MPa, about −550 MPa to about −300 MPa, about −550 MPa to about −350 MPa, about −550 MPa to about −400 MPa, about −550 MPa to about −450 MPa, about −550 MPa to about −500 MPa, about −500 MPa to about −300 MPa, about −500 MPa to about −350 MPa, about −500 MPa to about −400 MPa, or about −500 MPa to about −450 MPa.

The doped diamond-like carbon film can have an elastic modulus of greater than 150 GPa, such as about 175 GPa, about 200 GPa, or about 250 GPa to about 275 GPa, about 300 GPa, about 325 GPa, about 350 GPa, about 375 GPa, or about 400 GPa. For example, the doped diamond-like carbon film can have an elastic modulus of greater than 150 GPa to about 400 GPa, greater than 150 GPa to about 375 GPa, greater than 150 GPa to about 350 GPa, greater than 150 GPa to about 300 GPa, greater than 150 GPa to about 250 GPa, about 175 GPa to about 400 GPa, about 175 GPa to about 375 GPa, about 175 GPa to about 350 GPa, about 175 GPa to about 300 GPa, about 175 GPa to about 250 GPa, about 200 GPa to about 400 GPa, about 200 GPa to about 375 GPa, about 200 GPa to about 350 GPa, about 200 GPa to about 300 GPa, or about 200 GPa to about 250 GPa.

In some embodiments, the doped diamond-like carbon film is an underlayer for an extreme ultraviolet ("EUV") lithography process. In some examples, the doped diamond-like carbon film is an underlayer for an EUV lithography process and has an $sp^3$ hybridized carbon atom content of about 40% to about 90% based on the total amount of carbon atoms in the film, a density of greater than 2 g/cc to about 12 g/cc, and an elastic modulus that is greater than or about 150 GPa to about 400 GPa.

FIG. 1A depicts a schematic illustration of a substrate processing system 132 that can be used to perform doped diamond-like carbon film deposition in accordance with embodiments described herein. The substrate processing system 132 includes a process chamber 100 coupled to a gas panel 130 and a controller 110. The process chamber 100 generally includes a top wall 124, a sidewall 101 and a bottom wall 122 that define a processing volume 126. A substrate support assembly 146 is provided in the processing volume 126 of the process chamber 100. The substrate support assembly 146 generally includes an electrostatic chuck 150 supported by a stem 160. The electrostatic chuck 150 may be fabricated from aluminum, ceramic, and/or other suitable materials. The electrostatic chuck 150 may be moved in a vertical direction inside the process chamber 100 using a displacement mechanism (not shown).

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g., throttle valves and isolation valves) positioned between the process chamber 100 and the vacuum pump 102 to control the chamber pressure.

A gas distribution assembly 120 having a plurality of apertures 128 is disposed on the top of the process chamber 100 above the electrostatic chuck 150. The apertures 128 of the gas distribution assembly 120 are utilized to introduce process gases (e.g., deposition gas, dilution gas, carrier gas, purge gas) into the process chamber 100. The apertures 128 may have different sizes, numbers, distributions, shapes, designs, and diameters to facilitate the flow of the various processing gases for different process requirements. The gas distribution assembly 120 is connected to the gas panel 130 that allows various gases to supply to the processing volume 126 during processing. A plasma is formed from the processing gas mixture exiting the gas distribution assembly 120 to enhance thermal decomposition of the processing gases resulting in the deposition of material on a surface 191 of the substrate 190.

The gas distribution assembly 120 and the electrostatic chuck 150 may form a pair of spaced apart electrodes in the processing volume 126. One or more RF power sources 140 provide a bias potential through a matching network 138, which is optional, to the gas distribution assembly 120 to facilitate generation of plasma between the gas distribution assembly 120 and the electrostatic chuck 150. Alternatively, the RF power source 140 and the matching network 138 may be coupled to the gas distribution assembly 120, the electrostatic chuck 150, coupled to both the gas distribution assembly 120 and the electrostatic chuck 150, and/or coupled to an antenna (not shown) disposed exterior to the process chamber 100. In one or more examples, the RF power source 140 may produce power at a frequency of about 350 KHz, about 2 MHz, about 13.56 MHz, about 27 MHz, about 40 MHz, about 60 MHz, or about 100 MHz. In some embodiments, the RF power source 140 may provide power of about 100 watts to about 3,000 watts at a frequency of about 50 KHz to about 13.6 MHz. In other embodiments, the RF power source 140 may provide power of about 500 watts to about 1,800 watts at a frequency of about 50 KHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is coupled to the CPU 112 and may include cache, clock circuits, input/output systems, power supplies, and the like. Bi-directional communications between the controller 110 and the various components of the substrate processing system 132 may be handled through numerous signal cables collectively referred to as signal buses 118, some of which are illustrated in FIG. 1A.

Figure 1B:
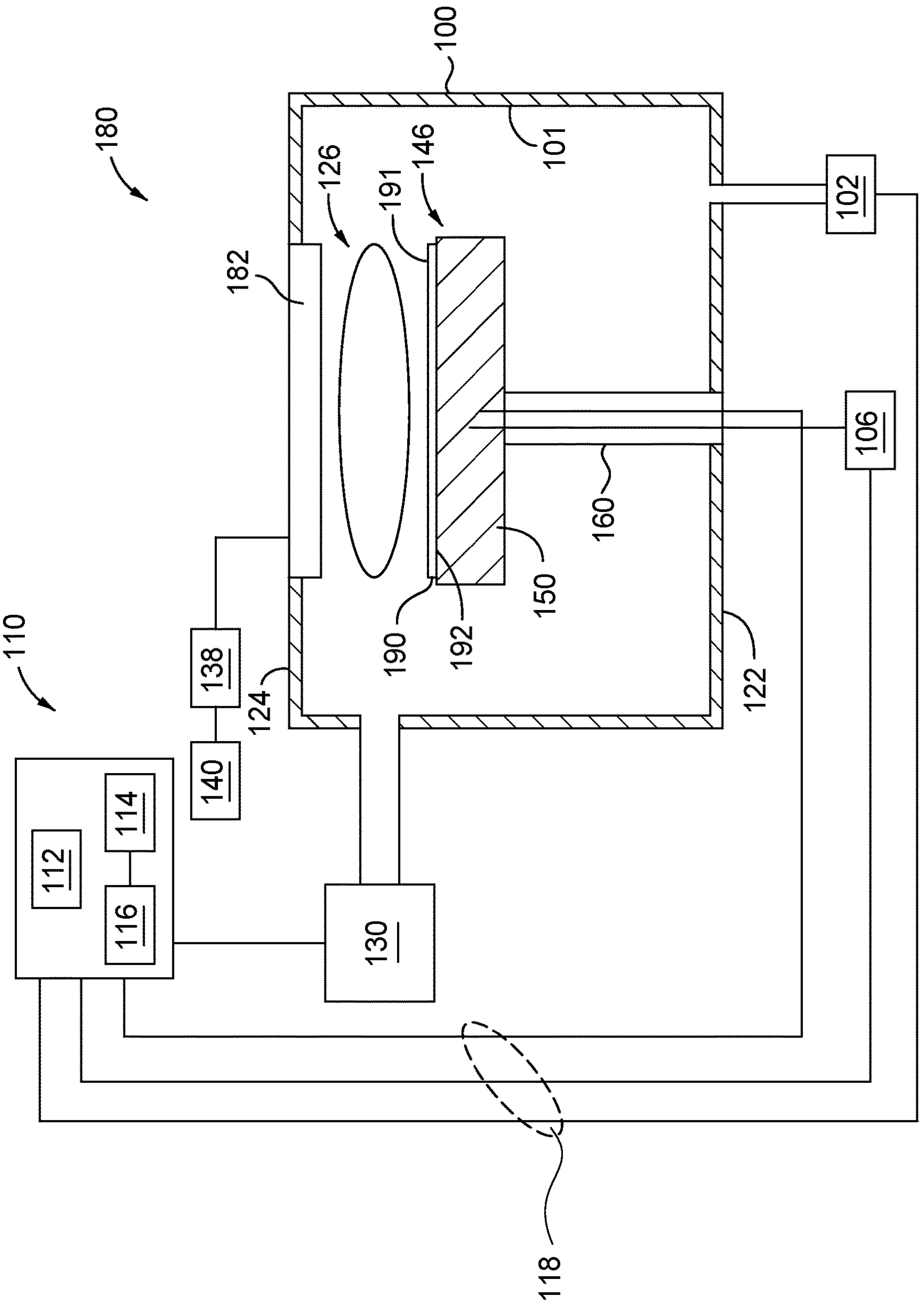
FIG. 1B depicts a schematic cross-sectional view of another deposition system that can be used for the practice of embodiments described herein.

FIG. 1B depicts a schematic cross-sectional view of another substrate processing system 180 that can be used for the practice of embodiments described herein. The substrate processing system 180 may be similar to the substrate processing system 132 of FIG. 1A, except that the substrate processing system 180 may be configured to flow processing gases from gas panel 130 across the surface 191 of the substrate 190 via the sidewall 101. In addition, the gas distribution assembly 120 depicted in FIG. 1A is replaced with an electrode 182. The electrode 182 may be configured for secondary electron generation. In one or more embodiments, the electrode 182 is a silicon-containing electrode.

Figure 2:
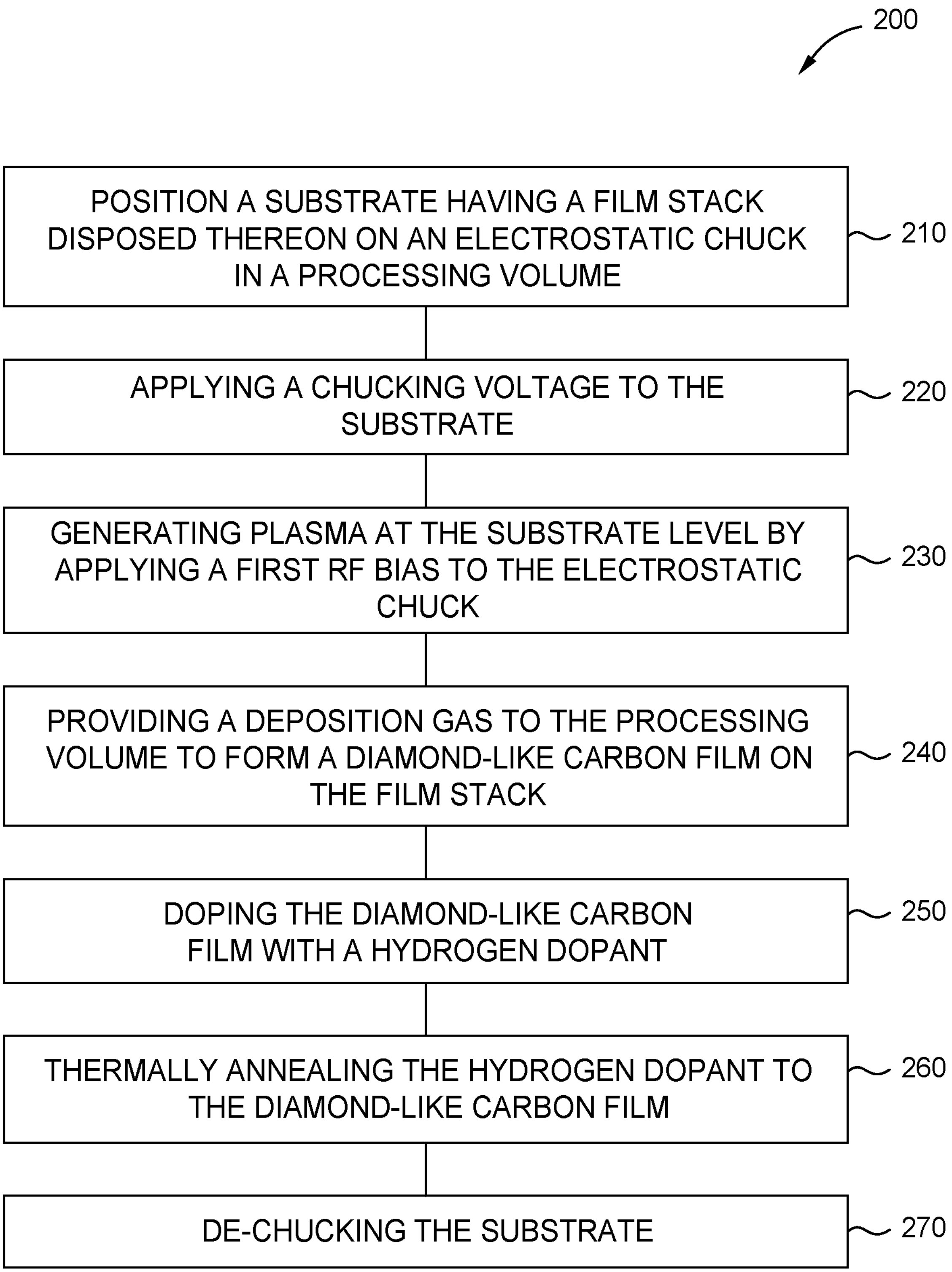
FIG. 2 depicts a flow diagram of a method for forming a doped diamond-like carbon film on a film stack disposed on a substrate in accordance with one or more embodiments of the present disclosure.
Figure 3A:
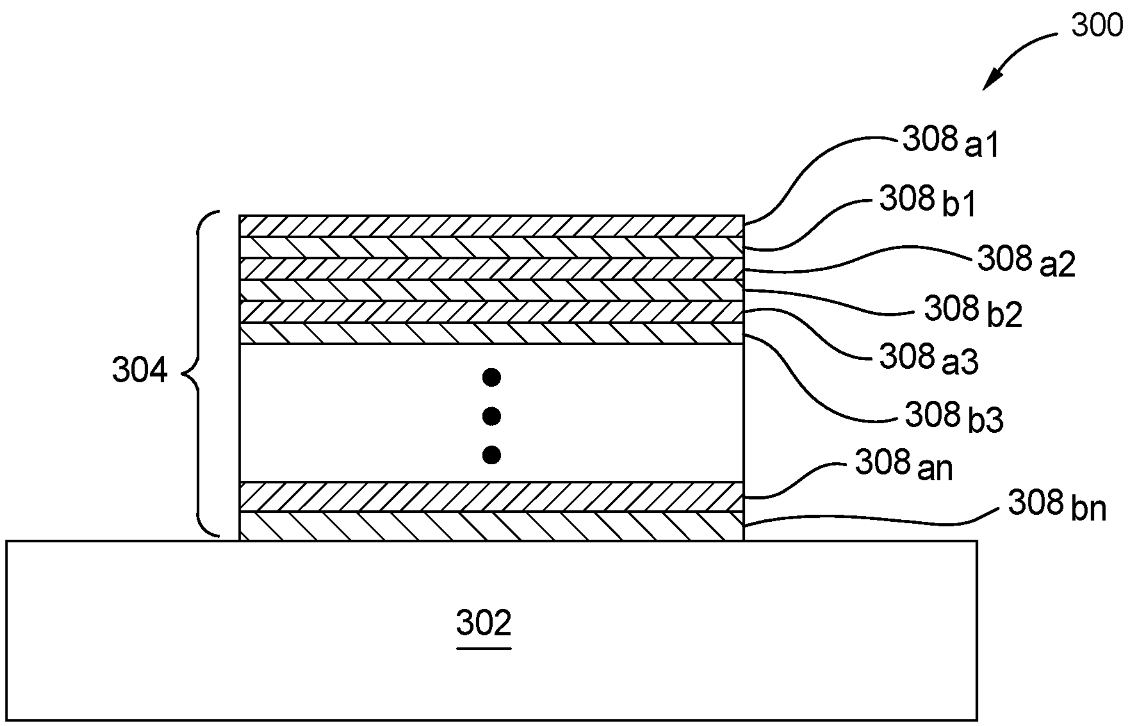
FIGS. 3A-3B depict a sequence for forming a doped diamond-like carbon film on a film stack formed on a substrate in accordance with one or more embodiments of the present disclosure.
Figure 3B:
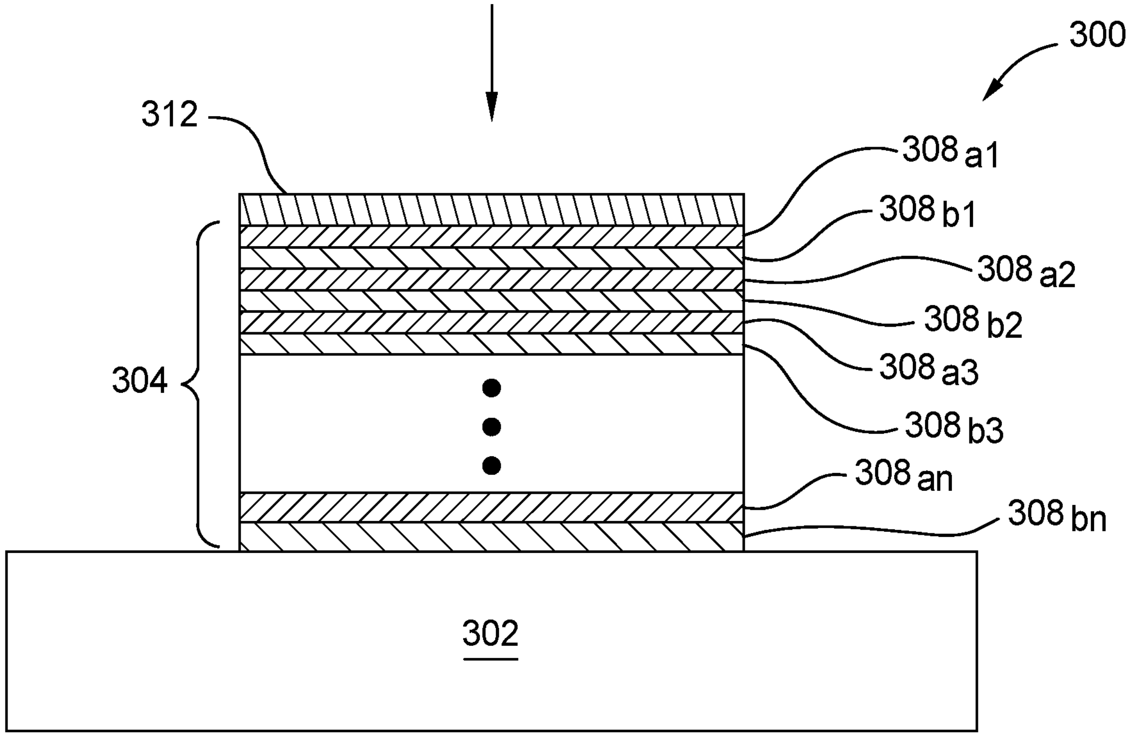

FIG. 2 depicts a flow diagram of a method 200 for forming a doped diamond-like carbon film on a film stack disposed on a substrate in accordance with one embodiment of the present disclosure. The doped diamond-like carbon film may be utilized, for example, as a hardmask to form stair-like structures in the film stack. FIGS. 3A-3B are schematic cross-sectional views illustrating a sequence for forming a doped diamond-like carbon film on a film stack disposed on a substrate according to the method 200. Although the method 200 is described below with reference to a hardmask layer that may be formed on a film stack utilized to manufacture stair-like structures in the film stack for three dimensional semiconductor devices, the method 200 may also be used to advantage in other device manufacturing applications. Further, it should also be understood that the operations depicted in FIG. 2 may be performed simultaneously and/or in a different order than the order depicted in FIG. 2.

The method 200 begins at operation 210 by positioning a substrate, such as a substrate 302 depicted in FIG. 3A, into a processing volume of a process chamber, such as the process chamber 100 depicted in FIG. 1A or FIG. 1B. The substrate 302 may be substrate 190 depicted in FIG. 1A and FIG. 1B. The substrate 302 may be positioned on an electrostatic chuck, for example, the upper surface 192 of the electrostatic chuck 150. The substrate 302 may be a silicon-based material or any suitable insulating material or conductive material as needed, having a film stack 304 disposed on the substrate 302 that may be utilized to form a structure 300, such as stair-like structures, in the film stack 304.

As shown in the embodiment depicted in FIG. 3A, the substrate 302 may have a substantially planar surface, an uneven surface, or a substantially planar surface having a structure formed thereon. The film stack 304 is formed on the substrate 302. In one or more embodiments, the film stack 304 may be utilized to form a gate structure, a contact structure or an interconnection structure in a front end or back end process. The method 200 may be performed on the film stack 304 to form the stair-like structures therein used in a memory structure, such as NAND structure. In one or more embodiments, the substrate 302 may be a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 302 may have various dimensions, such as 200 mm, 300 mm, 450 mm, or other diameter substrates, as well as, rectangular or square panels. Unless otherwise noted, embodiments and examples described herein are conducted on substrates with a 200 mm diameter, a 300 mm diameter, or a 450 mm diameter substrate. In the embodiment in which a SOI structure is utilized for the substrate 302, the substrate 302 may include a buried dielectric layer disposed on a silicon crystalline substrate. In one or more embodiments depicted herein, the substrate 302 may be a crystalline silicon substrate.

In one or more embodiments, the film stack 304 disposed on the substrate 302 may have a number of vertically stacked layers. The film stack 304 may include pairs including a first layer (shown as $\mathbf{308}a_1$, $\mathbf{308}a_2$, $\mathbf{308}a_3$, . . . , $\mathbf{308}a_n$) and a second layer (shown as $\mathbf{308}b_1$, $\mathbf{308}b_2$, $\mathbf{308}b_3$, . . . , $\mathbf{308}b_n$) repeatedly formed in the film stack 304. Each pair may include a first layer (shown as $\mathbf{308}a_1$, $\mathbf{308}a_2$, $\mathbf{308}a_3$, . . . , $\mathbf{308}a_n$) and a second layer (shown as $\mathbf{308}b_1$, $\mathbf{308}b_2$,

308$b_3$, . . . , 308$b_n$) that repeatedly alternates formed until a desired numbers of pairs of the first layers and the second layers are reached.

The film stack 304 may be a part of a semiconductor chip, such as a three-dimensional memory chip. Although three repeating layers of first layers (shown as 308$a_1$, 308$a_2$, 308$a_3$, . . . , 308$a_n$) and second layers (shown as 308$b_1$, 308$b_2$, 308$b_3$, . . . , 308$b_n$) are shown in FIGS. 3A-3B, it is noted that any desired number of repeating pairs of the first and the second layers may be utilized.

In one or more embodiments, the film stack 304 may be utilized to form multiple gate structures for a three-dimensional memory chip. The first layers 308$a_1$, 308$a_2$, 308$a_3$, . . . , 308$a_n$, formed in the film stack 304 may be a first dielectric layer and the second layers 308$b_1$, 308$b_2$, 308$b_3$, . . . , 308$b_n$ may be a second dielectric layer. Suitable dielectric layers may be utilized to form the first layers 308$a_1$, 308$a_2$, 308$a_3$, . . . , 308$a_n$ and the second layer 308$b_1$, 308$b_2$, 308$b_3$, . . . , 308$b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In one or more embodiments, the dielectric layers may be a high-k material having a dielectric constant greater than 4. Suitable examples of the high-k materials include hafnium oxide, zirconium oxide, titanium oxide, hafnium silicon oxide or hafnium silicate, hafnium aluminum oxide or hafnium aluminate, zirconium silicon oxide or zirconium silicate, tantalum oxide, aluminum oxide, aluminum doped hafnium dioxide, bismuth strontium titanium (BST), and platinum zirconium titanium (PZT), dopants thereof, or any combination thereof.

In one or more examples, the first layers 308$a_1$, 308$a_2$, 308$a_3$, . . . , 308$a_n$ are silicon oxide layers and the second layers 308$b_1$, 308$b_2$, 308$b_3$, . . . , 308$b_n$ are silicon nitride layers or polysilicon layers disposed on the first layers 308$a_1$, 308$a_2$, 308$a_3$, 308$a_n$. In one or more embodiments, the thickness of each first layer 308$a_1$, 308$a_2$, 308$a_3$, . . . , 308$a_n$ may be controlled to be about 50 Å to about 1,000 Å, such as about 500 Å, and the thickness of each second layer 308$b_1$, 308$b_2$, 308$b_3$, . . . , 308$b_n$ may be controlled to be about 50 Å to about 1,000 Å, such as about 500 Å. The film stack 304 may have a total thickness of about 100 Å to about 2,000 Å. In one or more embodiments, a total thickness of the film stack 304 is about 3 microns to about 10 microns and can vary as technology advances.

It is noted that the diamond-like carbon film may be formed on any suitable surface or any portion of the substrate 302 with or without the film stack 304 present on the substrate 302.

Returning to the method 200 of FIG. 2, at operation 220, a chucking voltage is applied to the electrostatic chuck and the substrate 402 clamped or otherwise disposed on the electrostatic chuck. In one or more embodiments, where the substrate 302 is positioned on the upper surface 192 of the electrostatic chuck 150, the upper surface 192 provides support and clamps the substrate 302 during processing. The electrostatic chuck 150 flattens the substrate 302 closely against the upper surface 192, preventing backside deposition. An electrical bias is provided to the substrate 302 via chucking electrode. The chucking electrode may be in electronic communication with the chucking power source 212 that supplies a biasing voltage to the chucking electrode. In one or more embodiments, the chucking voltage is about 10 volts to about 3,000 volts, about 100 volts to about 2,000 volts, or about 200 volts to about 1,000 volts.

During operation 220, several process parameters may be regulated. In one embodiment suitable for processing a 300 mm substrate, the process pressure in the processing volume may be maintained at about 0.1 m Torr to about 10 Torr (e.g., about 2 m Torr to about 50 m Torr; or about 5 m Torr to about 20 m Torr). In some embodiments suitable for processing a 300 mm substrate, the processing temperature and/or substrate temperature may be maintained at about −50° C. to about 350° C. (e.g., about 0° C. to about 50° C.; or about 10° C. to about 20° C.).

In one or more embodiments, a constant chucking voltage is applied to the substrate 302. In some embodiments, the chucking voltage may be pulsed to the electrostatic chuck 150. In other embodiments, a backside gas may be applied to the substrate 302 while applying the chucking voltage to control the temperature of the substrate. Backside gases may include, but are not limited to, helium, argon, neon, nitrogen ($N_2$), hydrogen ($H_2$), or any combination thereof.

At operation 230, a plasma is generated at the substrate, such as adjacent the substrate or near the substrate level, by applying a first RF bias to the electrostatic chuck. Plasma generated at the substrate may be generated in a plasma region between the substrate and the electrostatic chuck. The first RF bias may be from about 10 watts to about 3,000 watts at a frequency of about 350 KHz to about 100 MHz (e.g., about 350 KHz, about 2 MHz, about 13.56 MHz, about 27 MHz, about 40 MHz, about 60 MHz, or about 100 MHz). In one or more embodiments, the first RF bias is provided at a power of about 2,500 watts to about 3,000 watts at a frequency of about 13.56 MHz. In one or more embodiments, the first RF bias is provided to the electrostatic chuck 150 via the second RF electrode. The second RF electrode may be in electronic communication with the first RF power source that supplies a biasing voltage to the second RF electrode. In one or more embodiments, the bias power is about 10 watts to about 3,000 watts, about 2,000 watts to about 3,000 watts, or about 2,500 watts to about 3,000 watts. The first RF power source may produce power at a frequency of about 350 KHz to about 100 MHz (e.g., about 350 KHz, about 2 MHz, about 13.56 MHz, about 27 MHz, about 40 MHz, about 60 MHz, or about 100 MHz).

In one or more embodiments, operation 230 further includes applying a second RF bias to the electrostatic chuck. The second RF bias may be from about 10 watts to about 3,000 watts at a frequency of about 350 KHz to about 100 MHz (e.g., about 350 KHz, about 2 MHz, about 13.56 MHz, about 27 MHz, about 40 MHz, about 60 MHz, or about 100 MHz). In some examples, the second RF bias is provided at a power of about 800 watts to about 1,200 watts at a frequency of about 2 MHz. In other examples, the second RF bias is provided to the substrate 302 via the chucking electrode. The chucking electrode may be in electronic communication with second RF power source that supplies a biasing voltage to the chucking electrode. In one or more examples, the bias power is about 10 watts to about 3,000 watts, about 500 watts to about 1,500 watts, or about 800 watts to about 1,200 watts. The second RF power source may produce power at a frequency of about 350 KHz to about 100 MHz (e.g., about 350 KHz, about 2 MHz, about 13.56 MHz, about 27 MHz, about 40 MHz, about 60 MHz, or about 100 MHz). In one or more embodiments, the chucking voltage supplied in operation 220 is maintained during operation 230.

In some embodiments, during operation 230, the first RF bias is provided to the substrate 302 via the chucking electrode and the second RF bias may be provided to the substrate 302 via the second RF electrode. In one or more examples, the first RF bias is about 2,500 watts (about 13.56 MHz) and the second RF bias is about 1,000 watts (about 2 MHz).

During operation 240, a deposition gas is flowed into the processing volume 126 to form the diamond-like carbon film on the film stack. The deposition gas may be flowed from the gas panel 130 into the processing volume 126 either through the gas distribution assembly 120 or via the sidewall 101. The deposition gas may contain one or more hydrocarbon compounds and one or more dopant compounds. The hydrocarbon compound may include one, two, or more one hydrocarbon compounds in any state of matter. Similarly, the dopant compound may include one, two, or more one dopant compounds in any state of matter. The hydrocarbon and/or dopant compounds can be any liquid or gas, but some advantages may be realized if any of the precursors is a gas or vapor at room temperature, which may simplify the hardware needed for material metering, control, and delivery to the processing volume.

The deposition gas may further include an inert gas, a dilution gas, a nitrogen-containing gas, an etchant gas or any combination thereof. In one or more embodiments, the chucking voltage supplied during operation 220 is maintained during operation 240. In some embodiments, the process conditions established during operation 220 and plasma formed during operation 230 are maintained during operation 240.

In one or more embodiments, the hydrocarbon compound is a gaseous hydrocarbon or a liquid hydrocarbon. The hydrocarbon may include one or more alkanes, one or more alkenes, one or more alkynes, one or more aromatic, or any combination thereof. In some examples, the hydrocarbon compound has a general formula $C_xH_y$, where x has a range of 1 to about 20 and y has a range of 1 to about 20. Suitable hydrocarbon compounds include, for example, $C_2H_2$, $C_3H_6$, $CH_4$, $C_4H_8$, 1,3-dimethyladamantane, bicyclo[2.2.1]hepta-2,5-diene (2,5-norbornadiene), adamantine ($C_{10}H_{16}$), norbornene ($C_7H_{10}$), or any combination thereof. In one or more examples, ethyne is utilized due to formation of more stable intermediate species, which allows more surface mobility.

The hydrocarbon compound may include one or more alkanes (e.g., $C_nH_{2n+2}$, wherein n is from 1 to 20). Suitable hydrocarbon compounds include, for example, alkanes such as methane ($CH_4$), ethane ($C_2H_6$), propane ($C_3H_8$), butane ($C_4H_{10}$) and its isomer isobutane, pentane ($C_5H_{12}$), hexane ($C_6H_{14}$) and its isomers isopentane and neopentane, hexane ($C_6H_{14}$) and its isomers 2-methylpentane, 3-methylpentane, 2,3-dimethylbutane, and 2,2-dimethyl butane, or any combination thereof.

The hydrocarbon compound may include one or more alkenes (e.g., $C_nH_{2n}$, wherein n is from 1 to 20). Suitable hydrocarbon compounds include, for example, alkenes such as ethylene, propylene ($C_3H_6$), butylene and its isomers, pentene and its isomers, and the like, dienes such as butadiene, isoprene, pentadiene, hexadiene, or any combination thereof. Additional suitable hydrocarbons include, for example, halogenated alkenes such as monofluoroethylene, difluoroethylenes, trifluoroethylene, tetrafluoroethylene, monochloroethylene, dichloroethylenes, trichloroethylene, tetrachloroethylene, or any combination thereof.

The hydrocarbon compound may include one or more alkynes (e.g., $C_nH_{2n-2}$, wherein n is from 1 to 20). Suitable hydrocarbon compounds include, for example, alkynes such as ethyne or acetylene ($C_2H_2$), propyne ($C_3H_4$), butylene ($C_4H_8$), vinylacetylene, or any combination thereof.

The hydrocarbon compound may include one or more aromatic hydrocarbon compounds, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene, or any combination thereof.

Exemplary tungsten precursors may include tungsten hexafluoride, tungsten hexachloride, tungsten hexacarbonyl, bis(cyclopentadienyl) tungsten dihydride, bis(tertbutylimino) bis(dimethylamino) tungsten, or any combination thereof. Exemplary molybdenum precursors may include molybdenum pentachloride, molybdenum hexacarbonyl, bis (cyclopentadienyl) molybdenum dichloride, or any combination thereof. Exemplary cobalt precursors may include one or more of cobalt carbonyl compounds, cobalt amidinates compounds, cobaltocene compounds, cobalt dienyl compounds, complexes thereof, or any combination thereof. Exemplary cobalt precursors may include one or more of cyclopentadienyl dicarbonyl cobalt ($CpCo(CO)_2$), dicobalt hexacarbonyl butylacetylene (CCTBA), (cyclopentadienyl) (cyclohexadienyl) cobalt, (cyclobutadienyl) (cyclopentadienyl) cobalt, bis(cyclopentadienyl) cobalt, bis(methylcyclopentadienyl) cobalt, bis(ethylcyclopentadienyl) cobalt, cyclopentadienyl (1,3-hexadienyl) cobalt, (cyclopentadienyl) (5-methylcyclopentadienyl) cobalt and bis(ethylene) (pentamethylcyclopentadienyl) cobalt, or any combination thereof.

Exemplary nickel precursors may include bis(cyclopentadienyl) nickel, bis(ethylcyclopentadienyl) nickel, bis(methylcyclopentadienyl) nickel, allyl (cyclopentadienyl) nickel, or any combination thereof. Exemplary vanadium precursors may include vanadium pentachloride, bis(cyclopentadienyl) vanadium, or any combination thereof. Exemplary zirconium precursors may include zirconium tetrachloride, bis(cyclopentadienyl) zirconium dihydride, tetrakis(dimethylamino) zirconium, tetrakis(diethylamino) zirconium, or any combination thereof.

The hafnium precursor may include one or more of hafnium cyclopentadiene compounds, one or more of hafnium amino compounds, one or more of hafnium alkyl compounds, one or more of hafnium alkoxy compounds, substitutes thereof, complexes thereof, abducts thereof, salts thereof, or any combination thereof. Exemplary hafnium precursors may include bis(methylcyclopentadiene) dimethylhafnium ($(MeCp)_2HfMe_2$), bis(methylcyclopentadiene) methylmethoxyhafnium ($(MeCp)_2Hf(OMe)(Me)$), bis(cyclopentadiene) dimethylhafnium ($(Cp)_2HfMe_2$), tetra(tert-butoxy) hafnium, hafniumum isopropoxide ($(iPrO)_4Hf$), tetrakis(dimethylamino) hafnium (TDMAH), tetrakis (diethylamino) hafnium (TDEAH), tetrakis (ethylmethylamino) hafnium (TEMAH), isomers thereof, complexes thereof, abducts thereof, salts thereof, or any combination thereof.

Exemplary tantalum-containing compounds may include pentakis(ethylmethylamino) tantalum (PEMAT), pentakis (diethylamino) tantalum (PDEAT), pentakis(dimethylamino) tantalum (PDMAT) and any derivatives of PEMAT, PDEAT, and PDMAT. Exemplary tantalum-containing compounds also include tertbutylimino tris(diethylamino) tantalum (TBTDET), tertbutylimino tris(dimethylamino) tantalum (TBTDMT), bis(cyclopentadienyl) tantalum trihydride, bis(methylcyclopentadienyl) tantalum trihydride, and tantalum halides, $TaX_5$, where X is fluorine (F), bromine (Br) or chlorine (Cl), and/or derivatives thereof. Exemplary nitrogen-containing compounds include nitrogen gas, ammonia, hydrazine, methylhydrazine, dimethlyhydrazine, t-butylhydrazine, phenylhydrazine, azoisobutane, ethylazide, and derivatives thereof.

Exemplary silicon precursors may include silane, disilane, trisilane, tetrasilane, pentasilane, hexasilane, monochlorosilane, dichlorosilane, trichlorosilane, tetrachlorosilane, hexachlorosilane, substituted silanes, plasma derivatives thereof, or any combination thereof. Exemplary boron precursors may include diborane, triborane, tetraborane, triethylborane ($Et_3B$), dimethylamino borane, or any combination thereof.

The nitrogen-containing compound may include one or more of pyridine compounds, aliphatic amines, amines, nitriles, and similar compounds. Exemplary nitrogen-containing compounds may include nitrogen gas, atomic nitrogen, ammonia, hydrazine, methylhydrazine, dimethlyhydrazine, t-butylhydrazine, phenylhydrazine, azoisobutane, ethylazide, pyridine, and derivatives thereof. Exemplary phosphorous precursors may include phosphine, triphenylphosphine, trimethylphosphine, triethylphosphine, or any combination thereof. Exemplary germanium precursors may include germane, tetramethyl germanium, triethyl germanium hydride, triphenyl germanium hydride, or any combination thereof.

In one or more embodiments, the deposition gas further contains one or more dilution gases, one or more carrier gases, and/or one or more purge gases. Suitable dilution gases, carrier gases, and/or purge gases such as helium (He), argon (Ar), xenon (Xe), hydrogen ($H_2$), nitrogen ($N_2$), ammonia ($NH_3$), nitric oxide (NO), or any combination thereof, among others, may be co-flowed or otherwise supplied with the deposition gas into the processing volume 126. Argon, helium, and/or nitrogen can be used to control the density and deposition rate of the diamond-like carbon film. In some cases, the addition of $N_2$ and/or $NH_3$ can be used to control the hydrogen ratio of the diamond-like carbon film, as discussed below. Alternatively, dilution gases may not be used during the deposition.

In some embodiments, the deposition gas further contains an etchant gas. Suitable etchant gases may include chlorine ($Cl_2$), fluorine ($F_2$), hydrogen fluoride (HF), carbon tetrafluoride ($CF_4$), nitrogen trifluoride ($NF_3$), or any combination thereof. Not to be bound by theory, but it is believed that the etchant gases selectively etch $sp^2$ hybridized carbon atoms from the film thus increasing the fraction of $sp^3$ hybridized carbon atoms in the film, which increases the etch selectivity of the film.

At operation 250, after the diamond-like carbon film 312 is formed on the substrate during operation 240, the diamond-like carbon film 312 is exposed to a hydrogen dopant having one or more hydrogen radicals. In some embodiments, the diamond-like carbon film is exposed to hydrogen radicals during the deposition process of operation 240. The hydrogen radicals may be formed in an RPS and delivered to the processing region. Without being bound by theory, it is believed that exposing the diamond-like carbon film to hydrogen radicals may lead to selective etching of $sp^2$ hybridized carbon atoms thus increasing the $sp^3$ hybridized carbon atom fraction of the film and increasing the etch selectivity.

At operation 260, the doped diamond-like carbon film is thermally annealed with the hydrogen dopant. In some embodiments, the thermal anneal may include temperatures from about 300 to about 500 degrees Celsius, such as about 400 degrees Celsius. The thermal anneal may last from about 2 minutes to about 10 minutes, such as about 5 minutes. In some embodiments, thermally annealing a diamond-like carbon film increases the compressive stress, which may lead to increased line wiggling issues. Without being bound by theory, it is believed that thermally annealing the hydrogen dopant to the doped diamond-like carbon film decreases the compressive stress in the diamond-like carbon film. Exposing the film to hydrogen radicals in order to incorporate hydrogen in the carbon network via hydrogen doping followed by thermally annealing the hydrogen dopant to the doped diamond-like carbon film relaxes the film and lowers the compressive stress naturally found in diamond-like carbon films. In some embodiments, doping the diamond-like carbon film with hydrogen leads to a substantially neutral stress (e.g., about −100 MPa to about 100 MPa) in the diamond-like carbon film. In other embodiments, doping the diamond-like carbon film with hydrogen leads to a tensile stress. The magnitude of stress reduction is directly related to the hydrogen doping level, which can be controlled by the precursor flow ratio of carbon to hydrogen, the plasma power, the chamber pressure, and/or the chamber temperature.

At operation 270, after the doped diamond-like carbon film 312 is formed on the substrate, the substrate is de-chucked. During operation 270, the chucking voltage may be turned-off. The reactive gases are turned-off and optionally purged from the processing chamber. In one or more embodiments, during operation 270 RF power is reduced (e.g., to about 200 watt). Optionally, the controller 110 monitors impedance change to determine whether electrostatic charges are dissipated to ground through the RF path. Once the substrate is de-chucked from the electrostatic chuck, the remaining gases are purged from the processing chamber. The processing chamber is pumped down and the substrate is moved up on the lift pins and transferred out of chamber.

Figure 4:
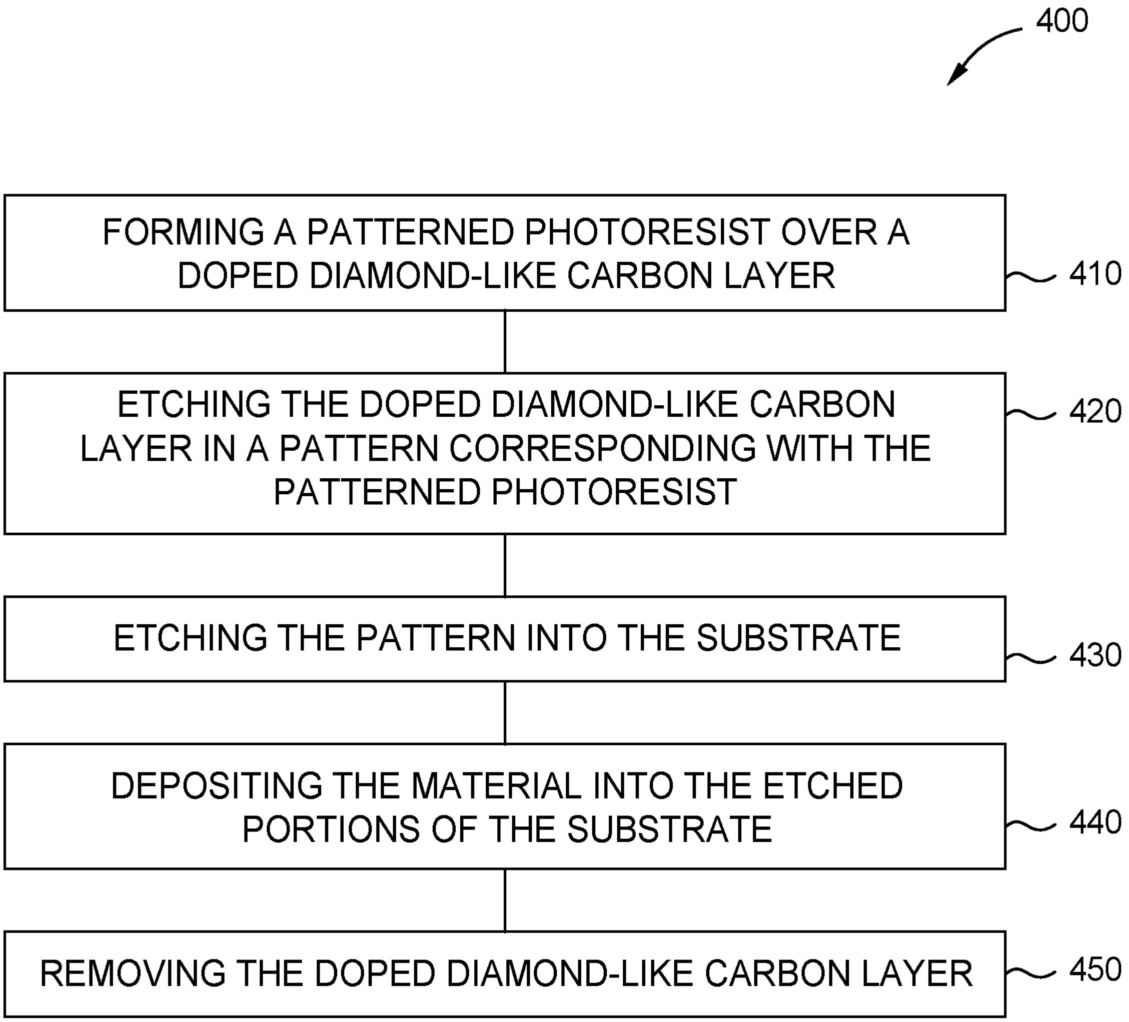
FIG. 4 depicts a flow diagram of a method of using a doped diamond-like carbon film in accordance with one or more embodiments of the present disclosure.

FIG. 4 depicts a flow diagram of a method 400 of using a doped diamond-like carbon film in accordance with one or more embodiments described and discussed herein. After the doped diamond-like carbon film 312 is formed on the substrate, the doped diamond-like carbon film 312 may be utilized in an etching process as a patterning mask to form a three-dimensional structure, such as a stair like structure. The doped diamond-like carbon film 312 may be patterned using standard photoresist patterning techniques.

At operation 410, a patterned photoresist (not shown) may be formed over the doped diamond-like carbon film 312. At operation 420, the doped diamond-like carbon film 312 may be etched in a pattern corresponding with the patterned photoresist layer followed by etching the pattern into the substrate 302 at operation 430. At operation 440, material may be deposited into the etched portions of the substrate 302. At operation 450, the doped diamond-like carbon film 312 may be removed using a solution comprising hydrogen peroxide and sulfuric acid. One exemplary solution containing hydrogen peroxide and sulfuric acid is known as Piranha solution or Piranha etch. The doped diamond-like carbon film 312 may also be removed using etch chemistries containing oxygen and halogens (e.g., fluorine or chlorine), for example, $Cl_2/O_2$, $CF_4/O_2$, $Cl_2/O_2/CF_4$. The doped diamond-like carbon film 312 may be removed by a chemical mechanical polishing (CMP) process.

Thus, methods and apparatus for forming a hardmask layer, which is or contains a doped diamond-like carbon film, which may be utilized to form stair-like structures for manufacturing three-dimensional stacking of semiconductor devices are provided. By utilizing the doped diamond-like carbon film as a hardmask layer with desired robust film properties and etching selectivity, an improved dimension and profile control of the resultant structures formed in a film stack may be obtained and the electrical performance of the chip devices may be enhanced, for example, in applications implementing three-dimensional stacking of semiconductor devices.

In summary, some of the benefits of the present disclosure provide a process for depositing or otherwise forming doped diamond-like carbon films on a substrate and thermally annealing the doped diamond-like carbon films. Typical PE-CVD hardmask films, such as diamond-like carbon films, have a high compressive stress. By doping the diamond-like carbon films with hydrogen and thermally annealing the hydrogen dopant to the doped diamond-like carbon films, a lessened stress profile is achieve, such as a neutral stress profile or even a tensile stress profile. Such neutral or tensile stress profiles reduce line wiggling issues which, in turn, helps eliminate abnormalities in the integrated circuit.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa. The term "about," as used here, refers to a range within +/−10% of the value.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

The invention claimed is:

1. A method of processing a substrate, comprising:

flowing a deposition gas comprising a hydrocarbon compound into a processing volume of a process chamber having a substrate positioned on an electrostatic chuck; and generating a plasma at the substrate by applying a first RF bias to the electrostatic chuck to deposit a diamond-like carbon film on the substrate;

doping the diamond-like carbon film with a hydrogen dopant to form a doped diamond-like carbon film; and following the doping of the diamond-like carbon film, thermally annealing the doped diamond-like carbon film.

2. The method of claim 1, wherein the doped diamond-like carbon film has a density of greater than or equal to about 2.5 g/cc.

3. The method of claim 1, wherein the doped diamond-like carbon film comprises a stress profile of about −100 MPa to about 100 MPa.

4. The method of claim 1, wherein the doped diamond-like carbon film has an atomic percent of hydrogen from about 0.01 atomic percent to about 30 atomic percent.

5. The method of claim 1, wherein the hydrogen dopant comprises at least one of H2.

6. The method of claim 1, wherein the hydrocarbon compound comprises at least one of ethyne, propene, methane, butene, 1,3-dimethyladamantane, bicyclo[2.2.1]hepta-2,5-diene, adamantine, or norbornene.

7. The method of claim 1, wherein the deposition gas further comprises helium, argon, xenon, neon, nitrogen (N2), hydrogen (H2), or any combination thereof.

8. The method of claim 1, wherein the processing volume is maintained at a pressure of about 5 m Torr to about 100 m Torr.

9. The method of claim 1, wherein the doped diamond-like carbon film has an elastic modulus of greater than 150 GPa.

10. The method of claim 1, wherein thermally annealing the doped diamond-like carbon film includes heating the processing chamber to a temperature of about 300 to about 500 degrees Celsius.

11. The method of claim 1, wherein thermally annealing the doped diamond-like carbon film is performed for about 2 minutes to about 10 minutes.

12. A method of processing a substrate, comprising:

flowing a deposition gas comprising a hydrocarbon compound and a hydrogen dopant into a processing volume of a process chamber having a substrate positioned on an electrostatic chuck, wherein the processing volume is maintained at a pressure of about 0.5 m Torr to about 10 Torr;

generating a plasma at the substrate by applying a first RF bias to the electrostatic chuck to deposit a doped diamond-like carbon film on the substrate formed by the hydrocarbon compound and the hydrogen dopant; and following the doping of the diamond-like carbon film, thermally annealing the doped diamond-like carbon film.

13. The method of claim 12, wherein the doped diamond-like carbon film has an atomic percent of hydrogen from about 0.01 atomic percent to about 30 atomic percent.

14. The method of claim 12, wherein the doped diamond-like carbon film comprises a stress profile of about −100 MPa to about 100 MPa.

15. The method of claim 12, wherein the hydrocarbon compound comprises at least one of ethyne, propene, methane, butene, 1,3-dimethyladamantane, bicyclo[2.2.1]hepta-2,5-diene, adamantine, or norbornene.

16. The method of claim 12, wherein the deposition gas further comprises at least one of helium, argon, xenon, neon, nitrogen (N2), or hydrogen (H2).

17. The method of claim 12, wherein the doped diamond-like carbon film has an elastic modulus of greater than 150 GPa.

18. The method of claim 12, wherein thermally annealing the doped diamond-like carbon film is performed for about 2 minutes to about 10 minutes.

19. A method of processing a substrate, comprising:

flowing a deposition gas comprising a hydrocarbon compound and a hydrogen dopant into a processing volume of a process chamber having a substrate positioned on an electrostatic chuck, wherein the electrostatic chuck comprises a chucking electrode and an RF electrode separate from the chucking electrode, wherein the processing volume is maintained at a pressure of about 0.5 mTorr to about 10 Torr;

generating a plasma at the substrate by applying a first RF bias to the RF electrode to deposit a doped diamond-like carbon film on the substrate formed by the hydrocarbon compound and the hydrogen dopant, wherein the doped diamond-like carbon film has a density of greater than 2.5 g/cc;

following the doping of the diamond-like carbon film, thermally annealing the doped diamond-like carbon film at a temperature of about 300 to about 500 degrees Celsius for a time of about 2 minutes to about 10 minutes, wherein the doped diamond-like carbon film has a substantially neutral stress;

forming a patterned photoresist layer over the doped diamond-like carbon film;

etching the doped diamond-like carbon film in a pattern corresponding with the patterned photoresist layer; and etching the pattern into the substrate.

20. The method of claim 19, wherein the doped diamond-like carbon film has an elastic modulus of greater than 150 GPa.

* * * * *